(12) United States Patent
Huang

(10) Patent No.: US 12,719,486 B2
(45) Date of Patent: Aug. 25, 2026

(54) TIME INTERLEAVED ANALOG TO DIGITAL CONVERTER AND SIGNAL CONVERSION METHOD

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 161 days.

(21) Appl. No.: 18/741,858

(22) Filed: Jun. 13, 2024

(65) Prior Publication Data

US 2024/0429932 A1 Dec. 26, 2024

(30) Foreign Application Priority Data

Jun. 20, 2023 (TW) ................................ 112123267

(51) Int. Cl.
*H03M 1/10* (2006.01)

(52) U.S. Cl.
CPC ................................ *H03M 1/1014* (2013.01)

(58) Field of Classification Search
CPC ............. H03M 1/1014; H03M 1/0624; H03M 1/0836; H03M 1/1033; H03M 1/1215
See application file for complete search history.

(56) References Cited

U.S. PATENT DOCUMENTS 8,542,142 B2 * 9/2013 Stein .................. H03M 1/0626 708/319
9,281,834 B1 * 3/2016 Waltari .............. H03M 1/1245
9,294,112 B1 * 3/2016 Devarajan ........... H03M 1/0836
10,312,927 B1 * 6/2019 Mirhaj ................ H03M 1/1033
10,530,379 B1 * 1/2020 Vaz ......................... H03M 1/46
11,641,210 B1 * 5/2023 Lok ..................... H03M 1/0836 341/120
2011/0276294 A1 * 11/2011 Ota ..................... G01R 35/005 702/85
2012/0050081 A1 * 3/2012 Bright ................ H03M 1/1215 341/122

(Continued)

OTHER PUBLICATIONS

N. Kurosawa, H. Kobayashi, K. Maruyama, H. Sugawara and K. Kobayashi, Explicit analysis of channel mismatch effects in time-interleaved ADC systems, in IEEE Transactions on Circuits and Systems I Fundamental Theory and Applications, vol. 48, No. 3, pp. 261-271, Mar. 2001, doi 10.110981.915383.

(Continued)

*Primary Examiner* — Lam T Mai
(74) *Attorney, Agent, or Firm* — WPAT, PC

(57) ABSTRACT

A time-interleaved analog-to-digital converter includes a plurality of channel circuitries, an output circuit, and a calibration circuitry. The plurality of channel circuitries are configured to sample an input signal to generate a plurality of first digital codes according to the input signal. The output circuit is configured to output a second digital code according to the plurality of first digital codes. The calibration circuitry is configured to adjust a sampling sequence of the plurality of channel circuitries for the input signal during an initial period, and control the plurality of channel circuitries to sample the input signal in the adjusted sampling sequence during an analog-to-digital conversion period.

17 Claims, 6 Drawing Sheets

(56) References Cited

U.S. PATENT DOCUMENTS

| | | | | |
|---|---|---|---|---|
| 2013/0214958 | A1* | 8/2013 | Stein | H03M 1/121 341/155 |
| 2014/0009318 | A1* | 1/2014 | Taluja | H03M 1/1009 341/118 |
| 2015/0326240 | A1* | 11/2015 | Tousi | H03M 1/1038 341/118 |
| 2016/0049949 | A1* | 2/2016 | Waltari | H03M 1/1023 341/120 |
| 2017/0117914 | A1* | 4/2017 | Choi | H03M 1/1033 |
| 2021/0359694 | A1* | 11/2021 | Chen | H03M 1/0624 |
| 2022/0224349 | A1* | 7/2022 | Varshney | H03M 1/0624 |
| 2022/0247420 | A1* | 8/2022 | Rajagopal | H03M 1/0836 |
| 2022/0247421 | A1* | 8/2022 | Pentakota | H03M 1/1038 |
| 2022/0302921 | A1* | 9/2022 | Dyer | G06F 18/214 |
| 2022/0321135 | A1* | 10/2022 | Chen | H03M 1/0836 |
| 2022/0345142 | A1* | 10/2022 | Han | H03M 1/1028 |
| 2023/0231565 | A1* | 7/2023 | Luo | H03M 1/1009 341/120 |
| 2024/0429933 | A1* | 12/2024 | Huang | H03M 1/1245 |

OTHER PUBLICATIONS

T.-H. Tsai, P. J. Hurst and S. H. Lewis, Correction of Mismatches in a Time-Interleaved Analog-to-Digital Converter in an Adaptively Equalized Digital Communication Receiver, in IEEE Transactions on Circuits and Systems I Regular Papers, vol. 56, No. 2, pp. 307-319, Feb. 2009, doi 10.1109TCSI.2008.2002114.

S. Saleem and C. Vogel, Adaptive Blind Background Calibration of Polynomial-Represented Frequency Response Mismatches in a Two-Channel Time-Interleaved ADC, in IEEE Transactions on Circuits, Jun. 2011.

I. M. Filanovsky, J. Järvenhaara and N. T. Tchamov, "Source follower: A misunderstood humble circuit," 2013 IEEE 56th International Midwest Symposium on Circuits and Systems (MWSCAS), Columbus, OH, USA, 2013, pp. 185-188, doi: 10.1109/MWSCAS.2013.6674616.

Shedge, Mr. D. K. et al. "Analysis and Design of CMOS Source Followers and Super Source Follower" (2013), ACEEE Int. J. on Control System and Instrumentation.

M. El-Chammas and B. Murmann, A 12-GSs 81-mW 5-bit Time-Interleaved Flash ADC With Background Timing Skew Calibration, in IEEE Journal of Solid-State Circuits, vol. 46, No. 4, pp. 838-847, Apr. 2011, doi: 10.1109/JSSC.2011.2108125.

OA letter of a counterpart TW application (appl. No. 112123267) mailed on Apr. 26, 2024. Summary of the TW OA letter: 1. Claims 1, 5-6, and 10 are rejected as allegedly being anticipated by cited reference 1 (US 2016/0049949 A1). 2. Claims 2-4 and 7-9 are allowable. Correspondence bewteen claims of TW counterpart application and claims of US application: 1. Claims 1-9 and 10 in TW counterpart application correspond to claims 1-9 and 13 in US application, respectively.

* cited by examiner

TIME INTERLEAVED ANALOG TO DIGITAL CONVERTER AND SIGNAL CONVERSION METHOD

BACKGROUND OF THE INVENTION

1. Field of the Invention

The present disclosure relates to an analog-to-digital converter, especially to a time-interleaved analog-to-digital converter and a signal conversion method that are able to adjust a sampling sequence.

2. Description of Related Art

In existing time-interleaved analog-to-digital converters, channels sample an input signal in a fixed sampling sequence. However, in practical applications, a skew may be present in the phases of the clock signals controlling the sampling sequence, which cause an inaccurate sampling sequence. Therefore, an additional phase error correction circuit is required to correct these clock signals, resulting in increased circuit area and power consumption. On the other hand, as the number of channels increases, mismatches caused by manufacturing process variations and other factors in the actual circuit also increase, which makes the predetermined fixed sampling sequence potentially unsuitable for the actual circuit. Under these conditions, if the original fixed sampling sequence is employed for sampling signals, the performance of the time-interleaved analog-to-digital converters may be reduced.

SUMMARY OF THE INVENTION

In some aspects of the present disclosure, an object of the present disclosure is, but not limited to, provide a time-interleaved analog-to-digital converter and a signal conversion method that are able to adjust the sampling sequence, so as to make an improvement to the prior art.

In some aspects of the present disclosure, a time-interleaved analog-to-digital converter includes a plurality of channel circuitries, an output circuit, and a calibration circuitry. The plurality of channel circuitries are configured to sample an input signal to generate a plurality of first digital codes according to the input signal. The output circuit is configured to output a second digital code according to the plurality of first digital codes. The calibration circuitry is configured to adjust a sampling sequence of the plurality of channel circuitries for the input signal during an initial period, and control the plurality of channel circuitries to sample the input signal in the adjusted sampling sequence during an analog-to-digital conversion period.

In some aspects of the present disclosure, a signal conversion method includes the following operations: sampling, by a plurality of channel circuitries, an input signal and generating a plurality of first digital codes according to the sampled input signal; outputting a second digital code according to the plurality of first digital codes; and adjusting a sampling sequence of the plurality of channel circuitries for the input signal according to the second digital code during an initial period, and controlling the plurality of channel circuitries to sample the input signal in the adjusted sampling sequence during an analog-to-digital conversion period.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For case of understanding, like elements in various figures are designated with the same reference number.

Figure 1:
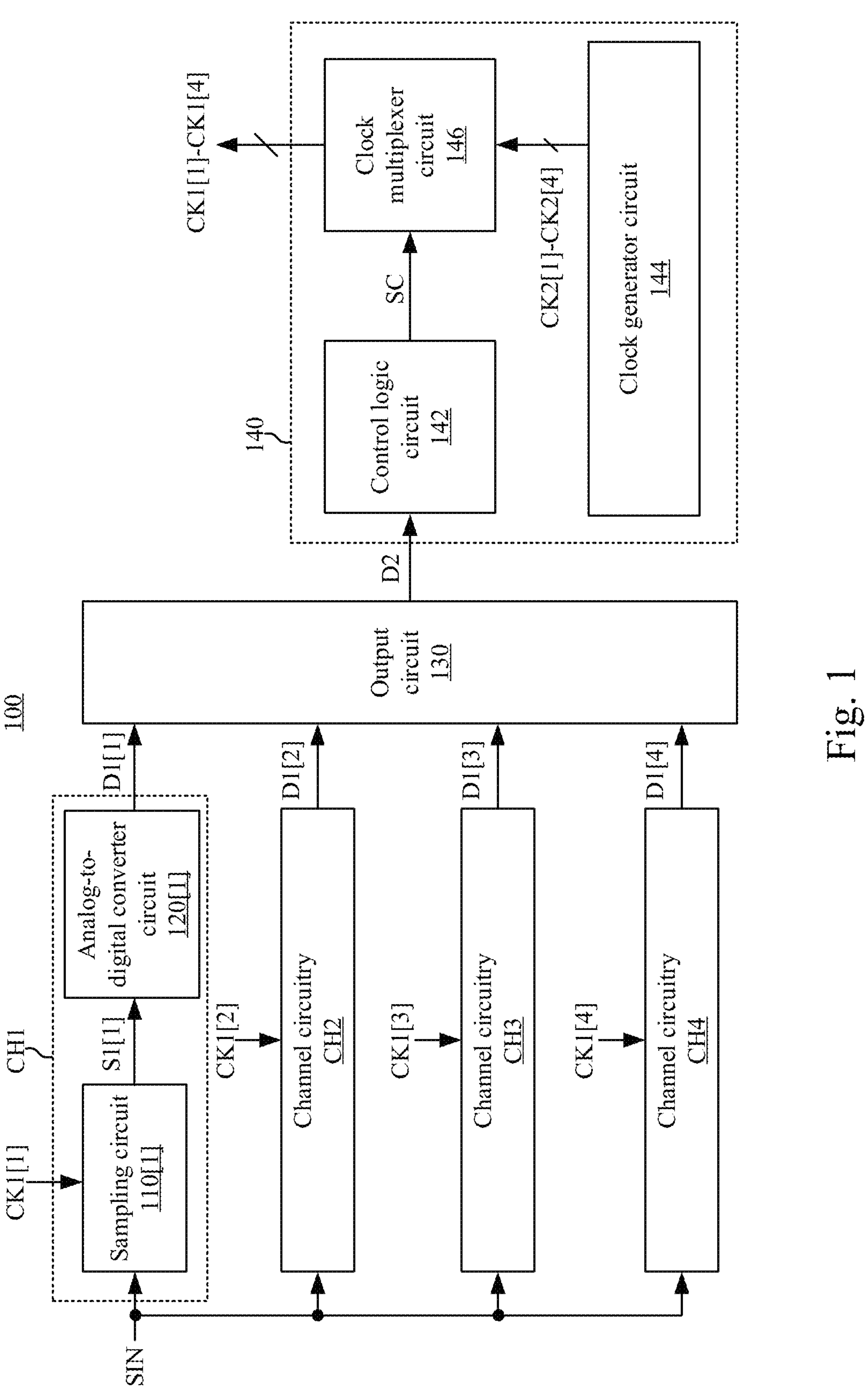
FIG. 1 illustrates a schematic diagram of a time-interleaved analog-to-digital converter according to some embodiments of the present disclosure.

FIG. 1 illustrates a schematic diagram of a time-interleaved analog-to-digital converter 100 according to some embodiments of the present disclosure. The time-interleaved analog-to-digital converter 100 includes channel circuitries CH1-CH4, an output circuit 130, and a calibration circuitry 140.

The channel circuitries CH1-CH4 are configured to sample an input signal SIN, in order to generate digital codes D1[1]-D1[4] according to the input signal SIN. For example, the channel circuitries CH1-CH4 may be turned on according to clock signals CK1[1]-CK1[4] to sequentially sample the input signal SIN, to generate the digital codes D1[1]-D1[4]. In this example, each of the channel circuitries CH1-CH4 includes a sampling circuit and an analog-to-digital converter circuit. Taking the channel circuitry CH1 as an example, the channel circuitry CH1 includes a sampling circuit 110[1] and an analog-to-digital converter circuit 120[1]. The sampling circuit 110[1] is turned on according to the corresponding clock signal CK1[1] in the clock signals CK1[1]-CK1[4] to sample the input signal SIN, in order to generate a signal S1. In some embodiments, the sampling circuit 110[1] may include a switch (not shown) and a capacitor (not shown). The switch is turned on according to the clock signal CK1[1] to transmit the input signal SIN to the capacitor, and the capacitor may thus sample the input signal SIN to generate the signal S1. The analog-to-digital converter circuit 120[1] may convert the signal S1 into the corresponding digital code D1[1] in the digital codes D1[1]-D1[4]. In different embodiments, the analog-to-digital converter circuit 120[1] may be, but is not limited to, a flash analog-to-digital converter circuit, a successive approximation register analog-to-digital converter circuit, a pipeline analog-to-digital converter circuit, etc., but the present disclosure is not limited thereto. Various types of analog-to-digital converter circuits are within the contemplated scope of the present disclosure.

Each of the channel circuitries CH1-CH4 may have the same circuit configuration. With this analogy, the configurations among the channel circuitries CH2-CH4, the clock signals CK1[2]-CK1[4], and the digital codes D1[2]-D1[4] can be understood.

The output circuit 130 is coupled to the channel circuitries CH1-CH4 to receive the digital codes D1[1]-D1[4]. The output circuit 130 may output a digital code D2 according to the digital codes D1[1]-D1[4]. In some embodiments, the output circuit 130 may be a parallel-to-serial converter circuit, which may convert parallel data (for example, the digital codes D1[1]-D1[4]) into serial data (for example, the digital code D2). In some embodiments, the output circuit 130 may be a multiplexer circuit.

The calibration circuitry 140 is configured to adjust the sampling sequence of the channel circuitries CH1-CH4 for the input signal SIN during an initial period (for example, a period after the time-interleaved analog-to-digital converter 100 is first powered on) according to the digital code D2, and to control these channel circuitries CH1-CH4 to sample the input signal SIN in the adjusted sampling sequence during an analog-to-digital conversion period (for example, a period that starts converting the valid input signal SIN after adjusting the sampling sequence). For example, the calibration circuitry 140 may output the clock signals CK2[1]-CK2[4] in a different sequence as the clock signals CK1[1]-CK1[4] during the initial period, where the phases of the clock signals CK2[1]-CK2[4] are sequentially different by a predetermined value. For example, the phases of the clock signals CK2[1]-CK2[4] in sequence may be about 0 degrees, 90 degrees, 180 degrees, and 270 degrees. The calibration circuitry 140 may determine a performance indicator related to the time-interleaved analog-to-digital converter 100 according to the digital code D2 obtained during the initial period, in order to determine a specific sequence for outputting the clock signals CK2[1]-CK2[4] as the clock signals CK1[1]-CK1[4], thereby determining the sampling sequence of the channel circuitries CH1-CH4. The detailed operation herein will be given later with reference to FIG. 2.

In some embodiments, the calibration circuitry 140 includes a control logic circuit 142, a clock generator circuit 144, and a clock multiplexer circuit 146. The control logic circuit 142 may execute operations described in FIG. 2 and generate a control signal SC accordingly. In some embodiments, the control logic circuit 142 may be a signal processing circuit with computational capabilities, which may be configured to perform operations in FIG. 2. In some embodiments, the calibration circuitry 140 may include one or more storage circuits (for example, but not limited to, registers), which may be configured to temporarily store information such as the aforementioned performance indicator and the values of the control signal SC. The clock generator circuit 144 may generate the clock signals CK2[1]-CK2[4]. In some embodiments, the clock generator circuit 144 may cooperate with a skew correction circuit to correct phase errors in the clock signals CK2[1]-CK2[4]. The clock multiplexer circuit 146 adjusts the sampling sequence of the channel circuitries CH1-CH4 for the input signal SIN by outputting the clock signals CK2[1]-CK2[4] in a different sequence as the clock signals CK1[1]-CK1[4] according to the control signal SC. In some embodiments, the clock signals CK2[1]-CK2[4] may be generated by other clock generator circuits in the system as well.

It is understood that the number of circuits shown in FIG. 1 is given for illustrative purposes, and the present disclosure is not limited thereto. In different embodiments, the time-interleaved analog-to-digital converter 100 may include more channel circuitries. Therefore, the present disclosure is not limited to the embodiments shown in FIG. 1.

Figure 2:
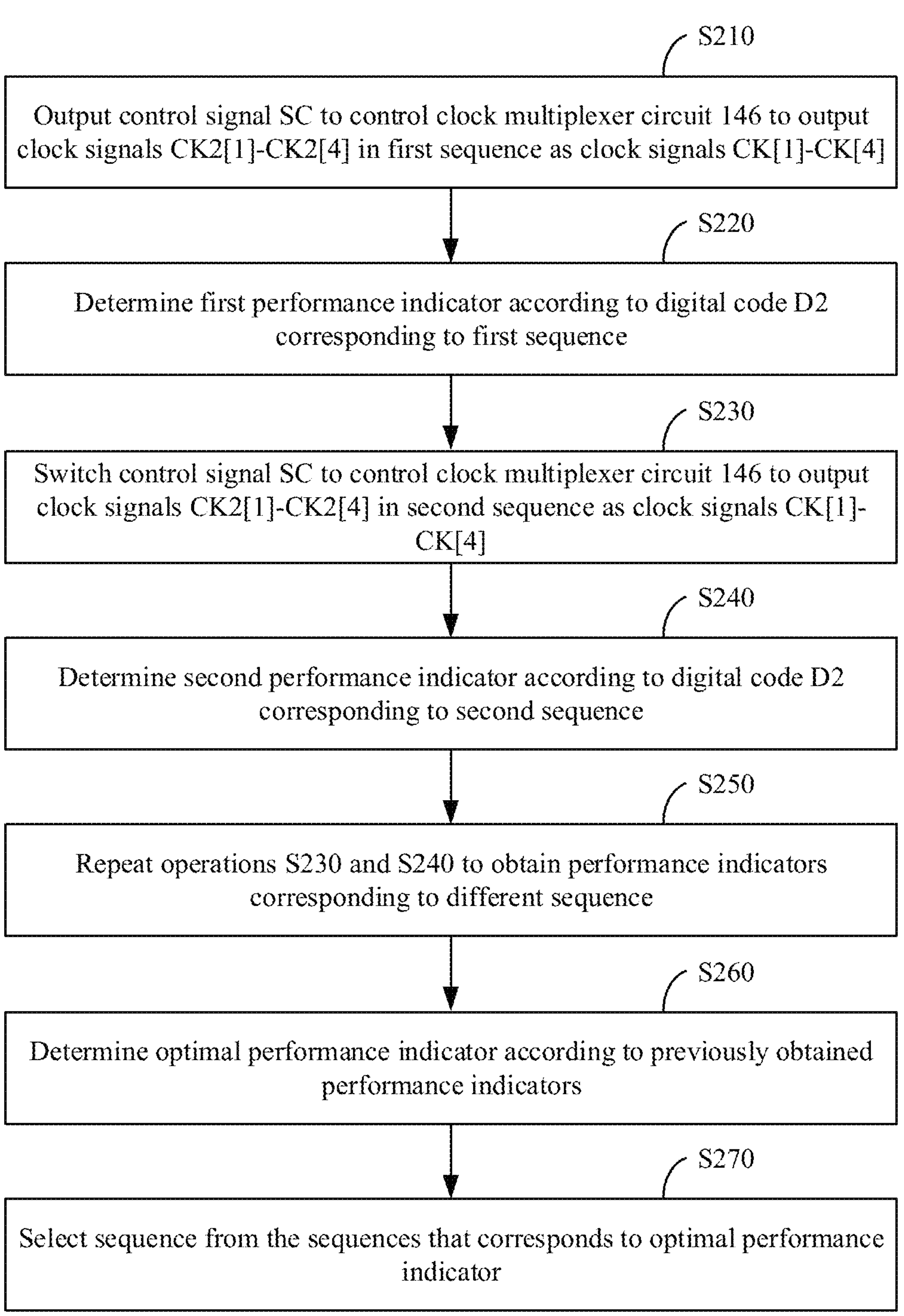
FIG. 2 illustrates a flowchart of operations performed by the calibration circuitry of FIG. 1 according to some embodiments of the present disclosure.

FIG. 2 illustrates a flowchart of operations performed by the calibration circuitry 140 of FIG. 1 according to some embodiments of the present disclosure. In some embodiments, the operations in FIG. 2 may be executed within the aforementioned initial period, but the present disclosure is not limited thereto. In some embodiments, the operations in FIG. 2 may be executed by circuits within the calibration circuitry 140 of FIG. 1.

In operation S210, the control signal SC is outputted to control the clock multiplexer circuit 146 to output the clock signals CK2[1]-CK2[4] in a first sequence as clock signals CK1[1]-CK1[4]. In operation S220, a first performance indicator is determined according to the digital code D2 corresponding to the first sequence.

For example, during the initial period, the control logic circuit 142 may output the control signal SC to control the clock multiplexer circuit 146 to output clock signals CK2[1]-CK2[4] in a first sequence as the clock signals CK1[1]-CK1[4]. In the first sequence, the clock signals CK2[1], CK2[2], CK2[3], and CK2[4] are respectively output as the clock signals CK1[1], CK1[2], CK1[3], and CK1[4]. During this initial period, the control logic circuit 142 may also switch the input signal SIN to a test signal. Under this condition, the phases of the clock signals CK1[1]-CK1[4] may be 0 degrees, 90 degrees, 180 degrees, and 270 degrees, respectively, such that the channel circuitries CH1-CH4 are sequentially turned on to sample the input signal SIN, thereby generating the corresponding digital code D2. In other words, the sampling sequence of the channel circuitries CH1-CH4 for the input signal SIN is adjusted to this first sequence. Thus, the control logic circuit 142 may determine the performance indicator corresponding to the first sequence according to this digital code D2.

In some embodiments, the aforementioned performance indicators include at least one of the effective number of bits (ENOB), spurious free dynamic range (SFDR), signal to noise ratio (SNR), or skew error. These performance indicators may be configured to indicate the resolution of the digital code D2 or the overall performance of the time-interleaved analog-to-digital converter 100. The aforementioned performance indicators are well known to those skilled in the art, and thus are not further elaborated here. These performance indicators are provided for illustrative purposes only, and the present disclosure is not limited thereto. Various performance indicators that may indicate the resolution of the digital code D2 or the performance of the time-interleaved analog-to-digital converter 100 are within the contemplated scope of the present disclosure.

With continued reference to FIG. 2, in operation S230, the control signal SC is switched to control the clock multiplexer circuit 146 to output the clock signals CK2[1]-CK2[4] in a second sequence as the clock signals CK1[1]-CK1[4]. In operation S240, a second performance indicator corresponding to the second sequence is determined according to the digital code D2. In operation S250, operations S230 and S240 are repeated to obtain performance indicators corresponding to different sequences. In operation S260, an optimal performance indicator is determined according to the previously obtained performance indicators. In operation S270, a sequence from the sequences that corresponds to this optimal performance indicator is selected.

For example, after obtaining the first performance indicator, the control logic circuit 142 may switch the control signal SC so that the clock multiplexer circuit 146 outputs the clock signals CK2[1]-CK2[4] in a second sequence as the clock signals CK1[1]-CK1[4]. For example, in the second sequence, the clock signals CK2[2], CK2[3], CK2[4], and CK2[1] are respectively output as the clock signals CK1[1], CK1[2], CK1[3], and CK1[4]. Under this condition, the phases of the clock signals CK1[1]-CK1[4] may sequentially be 90 degrees, 180 degrees, 270 degrees, and 0 degrees, such that the channel circuitries CH4, CH1, CH2, and CH3 are sequentially turned on to sample the input signal SIN, thereby generating the corresponding digital code D2. In other words, the sampling sequence of the channel circuitries CH1-CH4 for the input signal SIN is adjusted from the first sequence to the second sequence. The calibration circuitry 140 may determine the performance indicator corresponding to the second sequence according to this digital code D2.

With this analogy, the control logic circuit 142 may adjust the sampling sequence of the channel circuitries CH1-CH4 for the input signal SIN by switching the control signal SC, in order to obtain performance indicators corresponding to different sequences. The control logic circuit 142 may store all previously obtained performance indicators and determine the optimal performance indicator among those indicators. Thus, the control logic circuit 142 may select the optimal sequence (which corresponds to the optimal performance indicator) from the previously tested sequences and use the control signal SC corresponding to this optimal sequence to control the clock multiplexer circuit 146 to output the clock signals CK2[1]-CK2[4] in this optimal sequence as the clock signals CK1[1]-CK1[4] during the analog-to-digital conversion period. For example, if the control logic circuit 142 determines that the optimal performance indicator in the performance indicators is the second performance indicator (e.g., the second performance indicator has the highest ENOB, SFDR, or SNR, or has the lowest skew error) during the initial period, the control logic circuit 142 may store the control signal SC corresponding to this second sequence (which corresponds to the second performance indicator). During the analog-to-digital conversion period, the control logic circuit 142 may output the control signal SC corresponding to the second sequence, thereby adjusting the sampling sequence of the channel circuitries CH1-CH4 for the input signal SIN to this second sequence, in order to improve circuit performance.

In some related approaches, a time-interleaved analog-to-digital converter utilizes a predetermined fixed sampling sequence to sample an input signal SIN. In practical applications, phases of clock signals for controlling the sampling sequence may have errors. Therefore, an additional phase error correction circuit is employed in those approaches to pre-correct the phase errors. However, as the number of channels increases, the circuit area and power consumption required for the phase error correction circuit will significantly increase. On the other hand, due to mismatches among the sampling circuits in the channels caused by manufacturing process variations and other factors, the predetermined fixed sampling sequence may not be suitable for the actual circuit, which leads to a decrease in overall performance.

Compared with the aforementioned approaches, in some embodiments of the present disclosure, with aforementioned arrangements, the calibration circuitry 140 may utilize above operations to adjust the sampling sequence of the channel circuitries CH1-CH4 for the input signal SIN. In other words, the calibration circuitry 140 may run tests during the initial period to find a sampling sequence that may provide better performance for the time-interleaved analog-to-digital converter 100, and utilize the adjusted sampling sequence during the analog-to-digital conversion period to generate the digital code D2. Thus, the performance of the time-interleaved analog-to-digital converter 100 can be effectively improved without significantly increasing the circuit area and power consumption.

Figure 3:
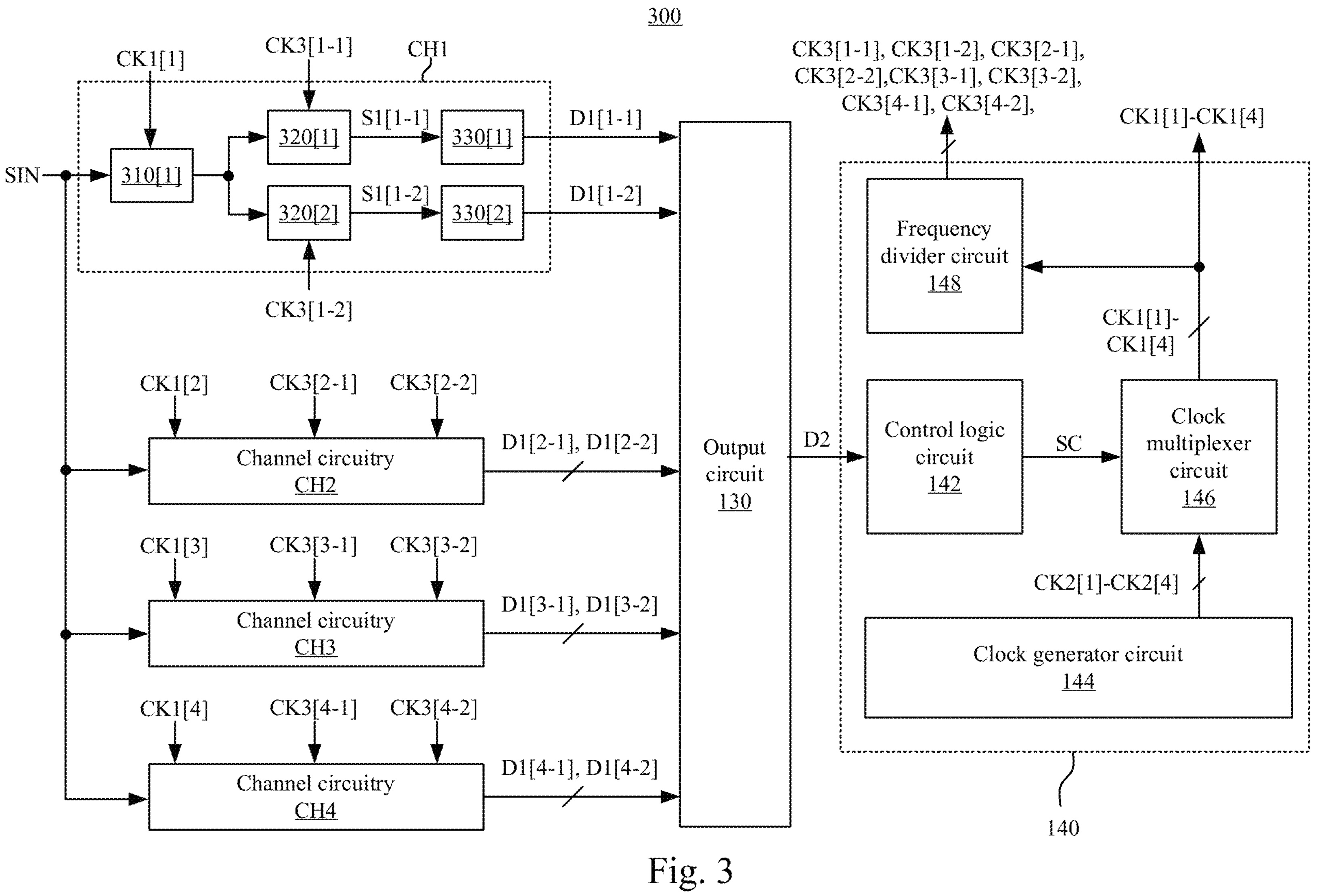
FIG. 3 illustrates a schematic diagram of a time-interleaved analog-to-digital converter according to some embodiments of the present disclosure.

FIG. 3 illustrates a schematic diagram of a time-interleaved analog-to-digital converter 300 according to some embodiments of the present disclosure. Compared with the time-interleaved analog-to-digital converter 100 in FIG. 1, each of the channel circuitries CH1-CH4 in the time-interleaved analog-to-digital converter 300 includes more sampling circuits and more analog-to-digital converter circuits.

Taking the channel circuitry CH1 as an example, the channel circuitry CH1 includes a sampling circuit 310[1], sampling circuits 320[1] and 320[2], and analog-to-digital converter circuits 330[1]-330[2]. The sampling circuit 310[1] is selectively turned on according to the corresponding clock signal CK1[1] in the clock signals CK1[1]-CK1[4], in order to transmit the input signal SIN to the sampling circuits 320[1] and 320[2]. The sampling circuits 320[1] and 320[2] sample the input signal SIN transmitted from the sampling circuit 310[1] according to clock signals CK3[1-1] and CK3[1-2], in order to generate signals S1[1-1] and S1[1-2]. The analog-to-digital converter circuits 330[1] and 330[2] are configured to convert the signals S1[1-1] and S1[1-2] to generate digital codes D1[1-1] and D1[1-2] (which may be equivalent to a part of the digital code D1[1] in FIG. 1). In some embodiments, the clock signals CK3[1-1] and CK3[1-2] may be generated based on the aforementioned corresponding clock signal CK1[1]. For example, the clock signals CK3[1-1] and CK3[1-2] may be generated by dividing the frequency of the clock signal CK1[1], and the clock signals CK3[1-1] and CK3[1-2] have a predetermined phase difference therebetween. Thus, the sampling circuits 320[1] and 320[2] may sequentially sample the input signal SIN transmitted from the sampling circuit 310[1] during a turn-on period of the sampling circuit 310[1]. The configuration of the sampling circuits 320[1] and 320[2] and that of the analog-to-digital converter circuits 330[1]-330[2] may be understood with reference to the sampling circuit 110[1] and the analog-to-digital converter circuit 120[1] in FIG. 1, and thus the repetitious descriptions are not further given. The configuration of the sampling circuit 310[1] will be given below with reference to FIGS. 5A and 5B.

Each of the channel circuitries CH1-CH4 may have the same circuit configuration. With this analogy, a corresponding relationship among the channel circuitries CH2-CH4, clock signals CK1[2]-CK1[4], the clock signals CK3[2-1], CK3[2-2], CK3[3-1], CK3[3-2], CK3[4-1], and CK3[4-2], and the digital codes D1[2-1], D1[2-2], D1[3-1], D1[3-2], D1[4-1], and D1[4-2] can be understood. Similar to FIG. 1, the output circuit 130 may output the digital code D2 according to the digital codes D1[1-1], D1[1-2], D1[2-1], D1[2-2], D1[3-1], D1[3-2], D1[4-1], and D1[4-2], and the calibration circuitry 140 is configured to adjust the sampling sequence of the channel circuitries CH1-CH4 for the input signal SIN during the initial period according to the digital code D2, and to control these channel circuitries CH1-CH4 to sample the input signal SIN in the adjusted sampling sequence during the analog-to-digital conversion period.

In greater detail, in this example, the calibration circuitry 140 further includes a frequency divider circuit 148. After the sampling sequence is adjusted, the frequency divider circuit 148 may divide the frequencies of the clock signals CK1[1]-CK1[4] and adjust the phases of the same to generate the clock signals CK3[1-1], CK3[1-2], CK3[2-1], CK3[2-2], CK3[3-1], CK3[3-2], CK3[4-1], and CK3[4-2]. For example, the frequency divider circuit 148 may divide the frequency of the clock signal CK1[1] and adjust the phase of the same to generate the clock signals CK3[1-1] and CK3[1-2], where the phase difference between the clock signals CK3[1-1] and CK3[1-2] may be about 180 degrees. Similarly, after the sampling sequence is adjusted, the frequency divider circuit 148 may divide the frequency of the clock signal CK1[2] and adjust the phase of the same to generate the clock signals CK3[2-1] and CK3[2-2], where the phase difference between the clock signals CK3[2-1] and CK3[2-2] may be about 180 degrees. With this analogy, the corresponding relationship between the clock signals CK1[3] and CK1[4] and the clock signals CK3[3-1], CK3[3-2], CK3[4-1], and CK3[4-2] can be understood. In some embodiments, the frequency divider circuit 148 may be implemented with other frequency divider circuits in the system.

It is understood that the number of circuits shown in FIG. 3 is shown for illustrative purposes, and the present disclosure is not limited thereto. In different embodiments, the time-interleaved analog-to-digital converter 300 may include more channel circuitries, and a single channel circuitry may include more sampling circuits and/or analog-to-digital converter circuits. Therefore, the present disclosure is not limited to the embodiments shown in FIG. 3.

Figure 4:
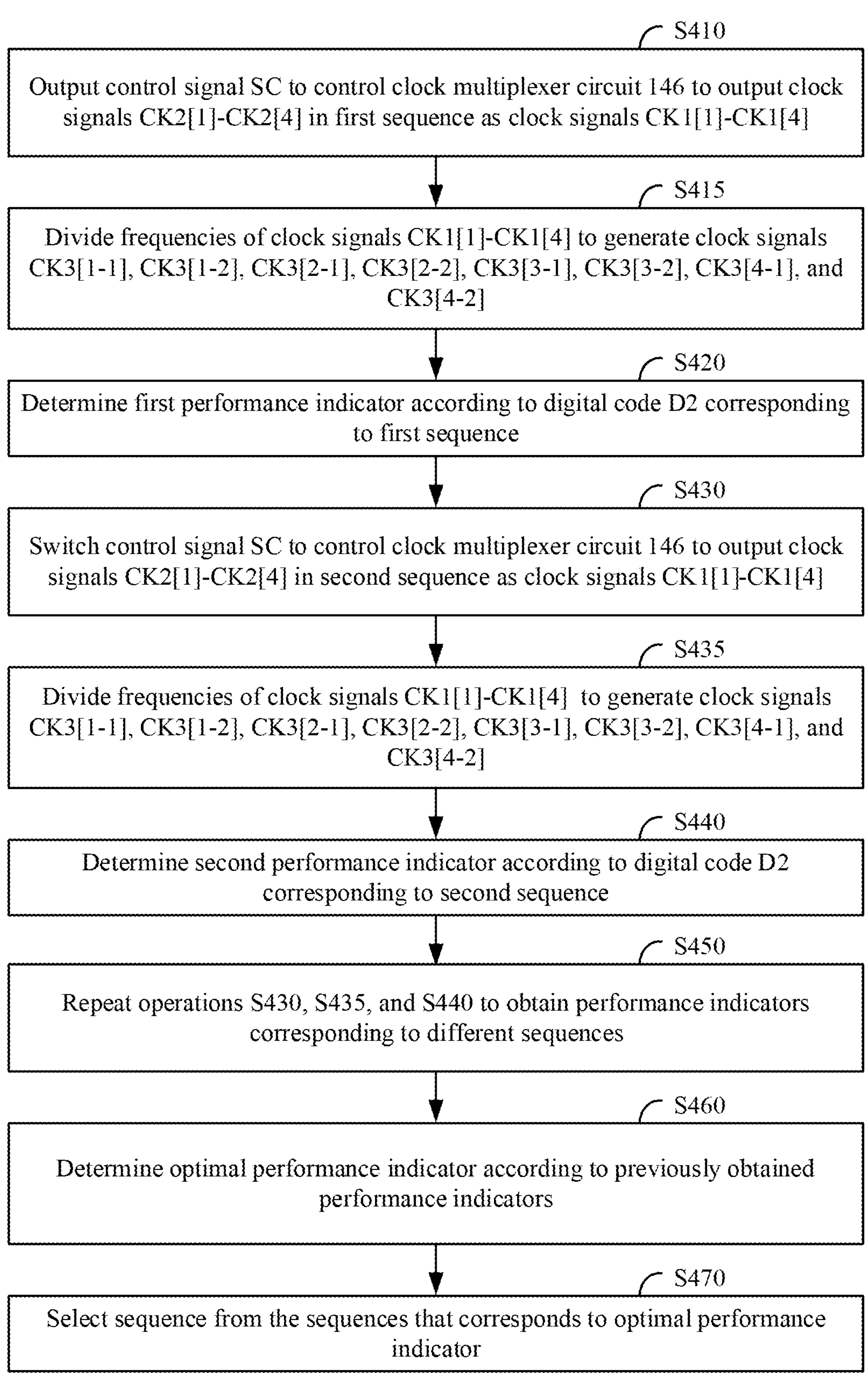
FIG. 4 illustrates a flowchart of operations performed by the calibration circuitry of FIG. 1 according to some embodiments of the present disclosure.

FIG. 4 illustrates a flowchart of operations performed by the calibration circuitry 140 of FIG. 1 according to some embodiments of the present disclosure. In some embodiments, the operations in FIG. 4 are performed within the aforementioned initial period, but the present disclosure is not limited thereto. In some embodiments, the operations in FIG. 4 may be executed by circuits in the calibration circuitry 140 of FIG. 3.

In operation S410, the control signal SC is outputted to control the clock multiplexer circuit 146 to output the clock signals CK2[1]-CK2[4] in a first sequence as the clock signals CK1[1]-CK1[4]. In operation S415, the frequencies of the clock signals CK1[1]-CK1[4] are divided to generate the clock signals CK3[1-1], CK3[1-2], CK3[2-1], CK3[2-2], CK3[3-1], CK3[3-2], CK3[4-1], and CK3[4-2]. In operation S420, a first performance indicator is determined according to the digital code D2 corresponding to the first sequence.

For example, during the initial period, the control logic circuit 142 may output the control signal SC to control the clock multiplexer circuit 146 to output the clock signals CK2[1]-CK2[4] in the first sequence as the clock signals CK1[1]-CK1[4], and the control logic circuit 142 may switch the input signal SIN to a test signal. Similarly, in the first sequence, the clock signals CK2[1], CK2[2], CK2[3], and CK2[4] are respectively output as the clock signals CK1[1], CK1[2], CK1[3], and CK1[4]. Under this condition, the phases of the clock signals CK1[1]-CK1[4] may sequentially be 0 degrees, 90 degrees, 180 degrees, and 270 degrees. The frequency divider circuit 148 may divide the frequency of the clock signal CK1[1] and adjust the phase of the same to generate the clock signals CK3[1-1] and CK3[1-2], and divide the frequency of the clock signal CK1[2] and adjust the phase of the same to generate clock signals CK3[2-1] and CK3[2-2]. Based on similar operations, the frequency divider circuit 148 may generate the clock signals CK3[3-1] and CK3[3-2] according to the clock signal CK1[3], and generate the clock signals CK3[4-1] and CK3[4-2] according to the clock signal CK1[4]. As a result, the channel circuitries CH1-CH4 may be sequentially turned on to sample the input signal SIN, thereby generating the corresponding digital code D2. In other words, the sampling sequence of the channel circuitries CH1-CH4 for the input signal SIN is adjusted to this first sequence, such that the control logic circuit 142 may determine the performance indicator corresponding to the first sequence according to this digital code D2.

With continued reference to FIG. 4, in operation S430, the control signal SC is switched to control the clock multiplexer circuit 146 to output the clock signals CK2[1]-CK2[4] in a second sequence as the clock signals CK1[1]-CK1[4]. In operation S435, the frequency frequencies of the clock signals CK1[1]-CK1[4] are divided to generate the clock signals CK3[1-1], CK3[1-2], CK3[2-1], CK3[2-2], CK3[3-1], CK3[3-2], CK3[4-1], and CK3[4-2]. In operation S440, a second performance indicator is determined according to the digital code D2 corresponding to the second sequence. In operation S450, operations S430, S435, and S440 are repeated to obtain performance indicators corresponding to different sequences. In operation S460, the optimal performance indicator is determined according to the previously obtained performance indicators. In operation S470, a sequence is selected from the sequences that corresponds to the optimal performance indicator.

For example, after obtaining the first performance indicator, the control logic circuit 142 may switch the control signal SC, so that the clock multiplexer circuit 146 outputs the clock signals CK2[1]-CK2[4] in the second sequence as the clock signals CK1[1]-CK1[4]. For example, in the second sequence, the clock signals CK2[2], CK2[3], CK2[4], and CK2[1] are respectively output as the clock signals CK1[1], CK1[2], CK1[3], and CK1[4]. Under this condition, the phases of the clock signals CK1[1]-CK1[4] may sequentially be 90 degrees, 180 degrees, 270 degrees, and 0 degrees. The frequency divider circuit 148 may divide the frequency of the clock signal CK1[1] and adjust the phase of the same to generate the clock signals CK3[1-1] and CK3[1-2], and perform the same operation according to the clock signals CK1[2], CK1[3], and CK1[4] to respectively generate the clock signals CK3[2-1], CK3[2-2], CK3[3-1], CK3[3-2], CK3[4-1], and CK3[4-2]. As a result, the channel circuitries CH4, CH1, CH2, and CH3 may be sequentially turned on to sample the input signal SIN, thereby generating the corresponding digital code D2. In other words, the sampling sequence of the channel circuitries CH1-CH4 for the input signal SIN is adjusted from the first sequence to the second sequence, and the frequency divider circuit 148 may accordingly generate the clock signals CK3[2-1], CK3[2-2], CK3[3-1], CK3[3-2], CK3[4-1], and CK3[4-2] corresponding to the second sequence. Thus, the calibration circuitry 140 may determine the performance indicator corresponding to the second sequence according to this digital code D2.

With this analogy, the control logic circuit 142 may adjust the sampling sequence of the channel circuitries CH1-CH4 for the input signal SIN by switching the control signal SC, to obtain performance indicators corresponding to different sequences. The control logic circuit 142 may store all previously obtained performance indicators and determine the optimal performance indicator among those performance indicators. Thus, the control logic circuit 142 may select the optimal sequence from the previously tested sequences and utilize the control signal SC corresponding to this optimal sequence to control the clock multiplexer circuit 146 to output the clock signals CK2[1]-CK2[4] in this optimal sequence as the clock signals CK1[1]-CK1[4] during the analog-to-digital conversion period, and the frequency divider circuit 148 may accordingly generate the clock signals CK3[1-1], CK3[1-2], CK3[2-1], CK3[2-2], CK3[3-1], CK3[3-2], CK3[4-1], and CK3[4-2] corresponding to this optimal sequence. For example, if the control logic circuit 142 determines that the optimal performance indicator among the performance indicators is the previously mentioned second performance indicator (e.g., the second performance indicator has the highest ENOB, SFDR, SNR, or the lowest skew error) during the initial period, the control logic circuit 142 may store the control signal SC corresponding to this second sequence (which corresponds to the second performance indicator). During the analog-to-digital conversion period, the control logic circuit 142 may output the control signal SC corresponding to the second sequence, thereby adjusting the sampling sequence of the channel circuitries CH1-CH4 to this second sequence, and the frequency divider circuit 148 may accordingly generate the clock signals CK3[1-1], CK3[1-2], CK3[2-1], CK3[2-2], CK3[3-1], CK3[3-2], CK3[4-1], and CK3[4-2] corresponding to this second sequence.

Figure 5A:
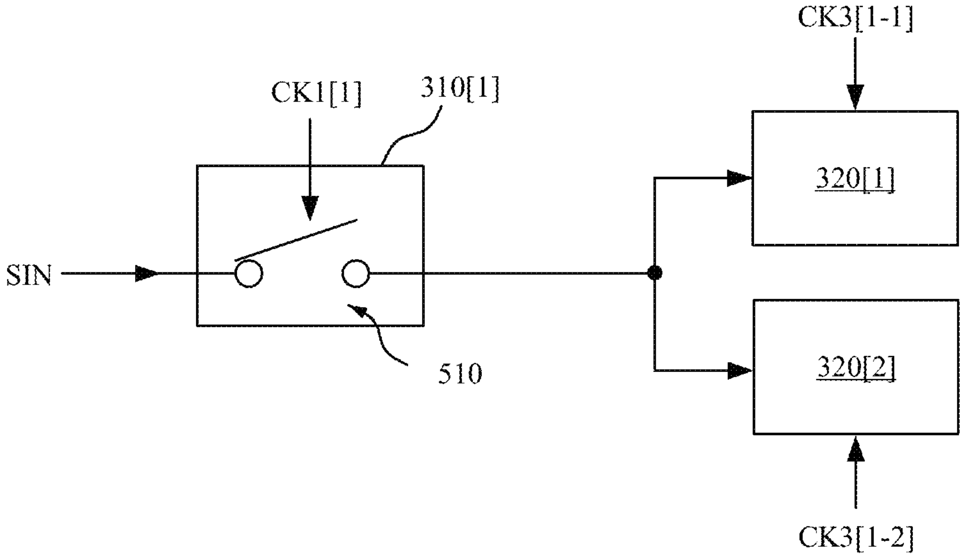
FIG. 5A illustrates a schematic diagram of a sampling circuit in FIG. 3 according to some embodiments of the present disclosure.

FIG. 5A illustrates a schematic diagram of a sampling circuit in FIG. 3 according to some embodiments of the present disclosure. In this example, the sampling circuit 310[1] includes a switch 510. A first terminal of the switch 510 receives the input signal SIN, a second terminal of the switch 510 is coupled to the sampling circuits 320[1] and 320[2], and a control terminal of the switch 510 receives the clock signal CK1[1]. The switch 510 may be selectively turned on according to the clock signal CK1[1] to transmit the input signal SIN to the sampling circuits 320[1] and 320[2]. Thus, the sampling circuits 320[1] and 320[2] may sequentially sample the input signal SIN according to the clock signals CK3[1-1] and CK3[1-2].

Figure 5B:
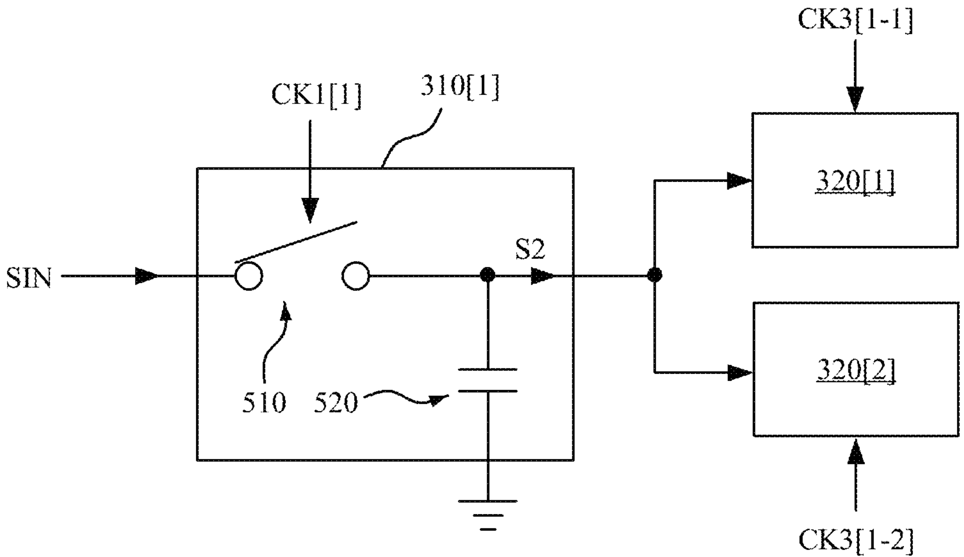
FIG. 5B illustrates a schematic diagram of a sampling circuit in FIG. 3 according to some embodiments of the present disclosure.

FIG. 5B illustrates a schematic diagram of a sampling circuit in FIG. 3 according to some embodiments of the present disclosure. Different from FIG. 5A, in this example, the sampling circuit 310[1] further includes a capacitor 520. The capacitor 520 is coupled between the second terminal of the switch 510 and ground. When the switch 510 is turned on according to the clock signal CK1[1], the switch 510 may transmit the input signal SIN to the capacitor 520. Thus, the capacitor 520 may store the input signal SIN and generate a signal S2 to the sampling circuits 320[1] and 320[2], and the sampling circuits 320[1] and 320[2] may sequentially sample the signal S2 according to the clock signals CK3[1-1] and CK3[1-2].

The configurations of the sampling circuit 310[1] are given for illustrative purposes, and the present disclosure is not limited thereto. Moreover, the number of components shown in the above figures are given for illustrative purposes, and the present disclosure is not limited thereto.

Figure 6:
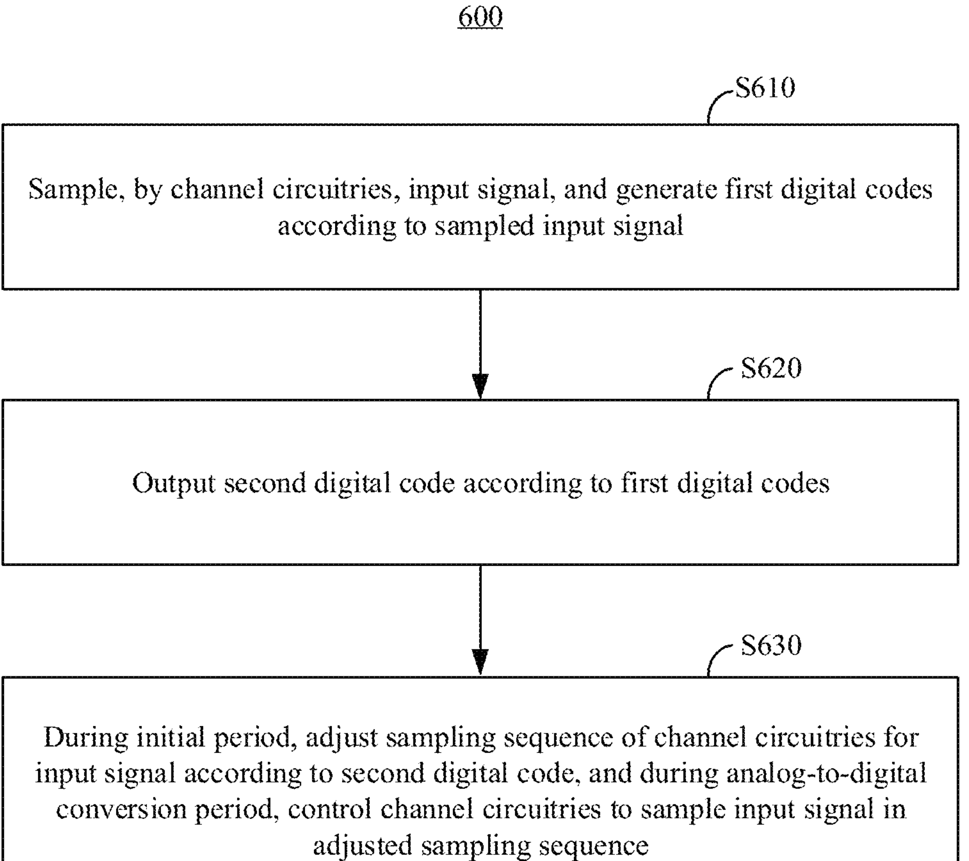
FIG. 6 illustrates a flowchart of a signal conversion method according to some embodiments of the present disclosure.

FIG. 6 illustrates a flowchart of a signal conversion method 600 according to some embodiments of the present disclosure. In some embodiments, the signal conversion method 600 may be executed by, but not limited to, the time-interleaved analog-to-digital converter 100 in FIG. 1 or the time-interleaved analog-to-digital converter 300 in FIG. 3.

In operation S610, an input signal is sampled by channel circuitries and first digital codes are generated according to the sampled input signal. In operation S620, a second digital code is outputted according to the first digital codes. In operation S630, the sampling sequence of the channel circuitries for the input signal is adjusted according to the second digital code during an initial period, and the channel circuitries are controlled to sample the input signal in the adjusted sampling sequence during an analog-to-digital conversion period.

The above operations of the signal conversion method 600 can be understood with reference to above embodiments, and thus the repetitious descriptions are not further given. The above operations in FIGS. 2, 4, and 6 include exemplary operations, but those operations are not necessarily performed in the order described above. Operations in FIGS. 2, 4, and 6 may be added, replaced, changed order, and/or eliminated, or the operations in FIGS. 2, 4, and 6 may be executed simultaneously or partially simultaneously as appropriate, in accordance with the spirit and scope of various embodiments of the present disclosure.

As described above, the time-interleaved analog-to-digital converter and the signal conversion method provided in some embodiments of the present disclosure may adjust the sampling sequence of the channel circuitries to find an appropriate sampling sequence, in order to improve the performance of the time-interleaved analog-to-digital converter.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A time-interleaved analog-to-digital converter, comprising:

a plurality of channel circuitries configured to sample an input signal to generate a plurality of first digital codes according to the input signal;

an output circuit configured to output a second digital code according to the plurality of first digital codes; and a calibration circuitry configured to adjust a sampling sequence of the plurality of channel circuitries for the input signal during an initial period, and control the plurality of channel circuitries to sample the input signal in the adjusted sampling sequence during an analog-to-digital conversion period, wherein the calibration circuitry is configured to output a plurality of second clock signals in different sequences as a plurality of first clock signals, and the plurality of channel circuitries are configured to sequentially sample the input signal according to the plurality of first clock signals.

2. The time-interleaved analog-to-digital converter of claim 1, wherein each of the plurality of channel circuitries comprises:

a sampling circuit configured to sample the input signal according to a corresponding one of the plurality of first clock signals, in order to generate a first signal; and an analog-to-digital converter circuit configured to convert the first signal to generate a corresponding one of the plurality of first digital codes.

3. The time-interleaved analog-to-digital converter of claim 2, wherein the calibration circuitry comprises:

a control logic circuit configured to output a control signal according to the second digital code during the initial period;

a clock generator circuit configured to generate the plurality of second clock signals; and a clock multiplexer circuit configured to output the plurality of second clock signals in different sequences as the plurality of first clock signals according to the control signal during the initial period.

4. The time-interleaved analog-to-digital converter of claim 1, wherein the calibration circuitry is configured to determine a performance indicator according to the second digital code during the initial period, and determine the adjusted sampling sequence according to the performance indicator.

5. The time-interleaved analog-to-digital converter of claim 4, wherein the performance indicator comprises at least one of an effective number of bits (ENOB), a signal to noise ratio (SNR), a spurious free dynamic range (SFDR), or a skew error.

6. The time-interleaved analog-to-digital converter of claim 1, wherein each of the plurality of channel circuitries comprises:

a first sampling circuit configured to be selectively turned on according to a corresponding clock signal in the plurality of first clock signals, in order to transmit the input signal;

a plurality of second sampling circuits configured to sample the input signal transmitted from the first sampling circuit according to a plurality of third clock signals, in order to generate a plurality of first signals; and a plurality of analog-to-digital converter circuits configured to convert the plurality of first signals to generate a part of the plurality of first digital codes.

7. The time-interleaved analog-to-digital converter of claim 6, wherein the calibration circuitry is further configured to divide a frequency of the corresponding clock signal to generate the plurality of third clock signals.

8. The time-interleaved analog-to-digital converter of claim 6, wherein the first sampling circuit comprises:

a switch configured to be selectively turned on according to the corresponding clock signal, in order to transmit the input signal to the plurality of second sampling circuits.

9. The time-interleaved analog-to-digital converter of claim 6, wherein the first sampling circuit comprises:

a capacitor; and a switch configured to be selectively turned on according to the corresponding clock signal, in order to transmit the input signal to the capacitor to generate a second signal, wherein the plurality of second sampling circuits are configured to sample the second signal according to the plurality of second clock signals to generate the plurality of first signals.

10. The time-interleaved analog-to-digital converter of claim 6, wherein the calibration circuitry comprises:

a control logic circuit configured to output a control signal according to the second digital code during the initial period;

a clock generator circuit configured to generate the plurality of second clock signals;

a clock multiplexer circuit configured to output the plurality of second clock signals in different sequences as the plurality of first clock signals according to the control signal during the initial period; and a frequency divider circuit configured to divide frequencies of the plurality of first clock signals to generate the plurality of third clock signals.

11. A signal conversion method, comprising:

sampling, by a plurality of channel circuitries, an input signal and generating a plurality of first digital codes according to the sampled input signal;

outputting a second digital code according to the plurality of first digital codes; and adjusting a sampling sequence of the plurality of channel circuitries for the input signal according to the second digital code during an initial period, and controlling the plurality of channel circuitries to sample the input signal in the adjusted sampling sequence during an analog-to-digital conversion period, wherein adjusting the sampling sequence of the plurality of channel circuitries for the input signal according to the second digital code during the initial period, and controlling the plurality of channel circuitries to sample the input signal in the adjusted sampling sequence during the analog-to-digital conversion period comprises:

outputting a plurality of second clock signals in different sequences as a plurality of first clock signals during the initial period, in order to adjust the sampling sequence, wherein the plurality of channel circuitries are configured to sequentially sample the input signal according to the plurality of first clock signals.

12. The signal conversion method of claim 11, wherein adjusting the sampling sequence of the plurality of channel circuitries for the input signal according to the second digital code during the initial period, and controlling the plurality of channel circuitries to sample the input signal in the adjusted sampling sequence during the analog-to-digital conversion period comprises:

determining a performance indicator according to the second digital code during the initial period; and determining the adjusted sampling sequence according to the performance indicator.

13. The signal conversion method of claim 12, wherein the performance indicator comprises at least one of an effective number of bits (ENOB), a signal to noise ratio (SNR), a spurious free dynamic range (SFDR), or a skew error.

14. The signal conversion method of claim 11, wherein each of the plurality of channel circuitries comprises a sampling circuit and an analog-to-digital converter circuit, and sampling, by the plurality of channel circuitries, the input signal and generating the plurality of first digital codes according to the sampled input signal comprises:

sampling, by the sampling circuit, the input signal according to a corresponding one of the plurality of first clock signals, in order to generate a first signal; and converting, by the analog-to-digital converter circuit, the first signal to generate a corresponding one of the plurality of first digital codes.

15. The signal conversion method of claim 11, wherein each of the plurality of channel circuitries comprises a first sampling circuit, a plurality of second sampling circuits, and an analog-to-digital converter circuit, and sampling, by the plurality of channel circuitries, the input signal and generating the plurality of first digital codes according to the sampled input signal comprises:

selectively turning on the first sampling circuit according to a corresponding clock signal in the plurality of first clock signals, in order to transmit the input signal;

sampling, by the plurality of second sampling circuits, the input signal transmitted from the first sampling circuit according to a plurality of third clock signals to generate a plurality of first signals; and converting, by the analog-to-digital converter circuit, the plurality of first signals to generate a part of the plurality of first digital codes.

16. The signal conversion method of claim 15, further comprising:

dividing a frequency of the corresponding clock signal to generate the plurality of third clock signals.

17. A time-interleaved analog-to-digital converter, comprising:

a plurality of channel circuitries configured to sample an input signal to generate a plurality of first digital codes according to the input signal;

an output circuit configured to output a second digital code according to the plurality of first digital codes; and a calibration circuitry configured to adjust a sampling sequence of the plurality of channel circuitries for the input signal during an initial period, and control the plurality of channel circuitries to sample the input signal in the adjusted sampling sequence during an analog-to-digital conversion period, wherein the calibration circuitry is configured to provide a plurality of first clock signals in different sequences to the plurality of channel circuitries, in order to adjust the sampling sequence.

* * * * *